US008828554B2

(12) United States Patent
Kawaguchi et al.

(10) Patent No.: US 8,828,554 B2
(45) Date of Patent: Sep. 9, 2014

(54) ELECTROCONDUCTIVE LAYER, LAMINATE USING THE SAME, AND PRODUCING PROCESSES THEREOF

(75) Inventors: Mutsuyuki Kawaguchi, Amagasaki (JP); Satoshi Saito, Amagasaki (JP); Tsuyoshi Amatani, Amagasaki (JP); Yuko Fujii, Amagasaki (JP)

(73) Assignee: Mec Company Ltd., Amagasaki-Shi (JP)

( * ) Notice: Subject to any disclaimer, the term of this patent is extended or adjusted under 35 U.S.C. 154(b) by 1103 days.

(21) Appl. No.: 12/352,048

(22) Filed: Jan. 12, 2009

(65) Prior Publication Data

US 2009/0197109 A1    Aug. 6, 2009

(30) Foreign Application Priority Data

Feb. 1, 2008  (JP) ................................. 2008-022616
Oct. 2, 2008  (JP) ................................. 2008-257486

(51) Int. Cl.
*B32B 15/20* (2006.01)
*H05K 3/38* (2006.01)

(52) U.S. Cl.
CPC ............... *H05K 3/388* (2013.01); *H05K 3/384* (2013.01); *H05K 2201/0355* (2013.01); *H05K 2203/0353* (2013.01); *H05K 2203/0361* (2013.01)
USPC ............................. 428/615; 428/626; 428/646

(58) Field of Classification Search
None
See application file for complete search history.

(56) References Cited

U.S. PATENT DOCUMENTS

| 4,657,632 A | 4/1987 | Holtzman et al. |
| 4,715,894 A | 12/1987 | Holtzman et al. |
| 4,816,070 A | 3/1989 | Holtzman et al. |
| 4,882,202 A | 11/1989 | Holtzman et al. |
| 6,126,806 A * | 10/2000 | Uzoh .............................. 205/182 |
| 2003/0049953 A1* | 3/2003 | Sausen ............................. 439/73 |
| 2004/0219375 A1 | 11/2004 | Kawaguchi et al. |
| 2004/0219377 A1 | 11/2004 | Kawaguchi et al. |
| 2006/0237225 A1* | 10/2006 | Kariya et al. .................. 174/260 |

FOREIGN PATENT DOCUMENTS

| EP | 0 216 531 A1 | 4/1987 |
| EP | 0 310 010 A2 | 4/1989 |
| EP | 0 469 703 A2 | 2/1992 |
| JP | 1-109796 | 4/1989 |
| JP | 4-233793 | 8/1992 |
| JP | 2000-340948 A | 12/2000 |
| JP | 2004-349693 A | 12/2004 |
| JP | 2005-23301 A | 1/2005 |
| JP | 2006-159634 A | 6/2006 |
| JP | 2007-273896 A | 10/2007 |

* cited by examiner

*Primary Examiner* — Adam Krupicka
(74) *Attorney, Agent, or Firm* — Knobbe Martens Olson & Bear LLP

(57) ABSTRACT

The object of the present invention is to provide an electroconductive layer that retains bondability to a resin layer certainly and is further a layer from which a copper-tin alloy layer is easily removed in a subsequent step, a laminate using this layer, and producing processes thereof. The electroconductive layer of the present invention is an electroconductive layer which is to be bonded to a resin layer, and which contains a copper layer and a copper-tin alloy layer laminated over the copper layer, wherein the copper-tin alloy layer has a thickness of 0.001 to 0.020 μm.

11 Claims, 2 Drawing Sheets

ELECTROCONDUCTIVE LAYER, LAMINATE USING THE SAME, AND PRODUCING PROCESSES THEREOF

BACKGROUND OF THE INVENTION

1. Field of the Invention

The present invention relates to an electroconductive layer which is to be bonded to a resin layer, a laminate using this layer, and producing processes thereof.

2. Description of Related Art

Ordinary multilayer wiring boards are each produced by laminating/pressing an inner layer substrate having, on its surface, an electroconductive layer made of copper onto a different inner layer substrate and/or a copper foil with a prepreg interposed therebetween. Their electroconductive layers are connected electrically to each other through a penetrating hole having a hole-wall plated with copper, which is called a through hole. On the electroconductive layer surface of the inner layer substrate, for example, a copper oxide in a needle form, which is called black oxide or brown oxide, may be formed in order to improve the bondability to the prepreg. According to this manner, the needle-form copper oxide penetrates the prepreg to produce an anchor effect. Thus, the bondability is improved.

The copper oxide is excellent in bondability to the prepreg; however, when the copper oxide contacts an acidic solution in a plating step of forming through holes, the oxide is dissolved and discolored to result in a problem that a defect called hallowing is easily caused.

Thus, as a method substituted for the use of black oxide or brown oxide, suggested is a method for forming a tin layer on the surface of a copper layer of an inner layer substrate as disclosed in EP-A1-0 216 531 and JP-A-4-233793. Further, JP-A-1-109796 suggests a method for forming a tin layer on such a copper layer surface, and furthermore subjecting the resultant to treatment with a silane compound in order to improve the bondability of the copper layer to a resin layer. Moreover, JP-A-2000-340948 suggests a method for forming a tin layer on such a copper layer surface in order to improve the bondability of the copper layer to a resin layer similarly, and furthermore suggests a technique for making the copper layer surface rough by etching, thereby expressing an anchor effect. Besides EP-A1-0 216 531, JP-A-2005-23301 and JP-A-2004-349693 suggest a method of forming, on such a copper layer surface, a tin plating treated layer wherein tin, copper and metal(s) other than these are mixed with each other.

SUMMARY OF THE INVENTION

However, according to a method for forming an ordinary tin layer as disclosed in EP-A1-0 216 531, JP-A-4-233793, JP-A-1-109796 and JP-A-2000-340948, it is feared that diffusion (ion migration) based on whisker is generated. Further, in particular, in the case of using the so-called hard resin, which has a high glass transition temperature, an effect of improving the bondability between the copper layer and the resin layer is insufficient in some cases. Moreover, in a case where tin needs to be removed in a subsequent step, the removal thereof is difficult since the tin layer usually has a thickness of 1 µm or more. Here, the case where tin needs to be removed in a subsequent is, for example, a case where openings in a solder resist are plated with nickel/gold. At this time, tin may hinder the plating treatment; thus, it is necessary to remove tin by etching or the like. In this case, the amount of the etching needs to be increased in order to remove the tin layer which has a large thickness. As a result, there is caused a problem that a wiring pattern in the solder resist opening may be made thin. Furthermore, when an ordinary tin layer has a thickness not less than a specified thickness, diffusion between tin in the layer and copper in an underlying layer thereof advances with the passage of time, so that the thickness of the copper-tin alloy layer changes so as to become large. As a result, with the passage of time, the removal of the tin layer or the copper-tin alloy layer may become difficult.

Even if the surface of an ordinary tin layer is treated with a silane compound as in JP-A-1-109796, the bondability thereof to a resin layer is insufficient, in particular, under severe conditions, such as high temperature, high humidity, and high pressure. Further, in a case where the copper layer surface is made rough by etching as in JP-A-2000-340948, irregularities are also made in the tin layer surface; however, when the electroconductive layer surface has the irregularities, the irregularities produce an effect to increase a power loss in transmission lines. Thus, it is difficult to apply this technique to an electroconductive layer into which a high-frequency current is to be caused to flow. Furthermore, in a case where a metal other than copper and tin is mixed as in JP-A-2005-23301 and JP-A-2004-349693, it is feared that even when the thickness of the tin plating treated layer is small, the metal other than tin hinders the removal of the tin plating treated layer.

The present invention has been made in light of the above-mentioned actual situation, and an object thereof is to provide an electroconductive layer that retains bondability to a resin layer certainly and is further a layer from which a copper-tin alloy layer is easily removed in a subsequent step, a laminate using this layer, and producing processes thereof.

The electroconductive layer of the present invention is an electroconductive layer which is to be bonded to a resin layer, and which contains a copper layer and a copper-tin alloy layer laminated over the copper layer, wherein the copper-tin alloy layer has a thickness of 0.001 to 0.020 µm.

Here, in the invention, the "copper layer" may be a layer made of pure copper, or may also be a layer made of a copper alloy. Further, in the present specification, "copper" refers to pure copper or a copper alloy. The copper alloy may be, for example, brass, bronze, white copper, arsenical copper, silicon copper, titanium copper, or chromium copper, etc. In accordance with the use purpose of the electroconductive layer, the copper layer may contain any other element. Further, in the specification, the thickness of the copper-tin alloy layer denotes the following unless otherwise specified: the thickness obtained by Ar sputtering to the layer at an accelerating voltage of 5 kV by X-ray photoelectron spectrometry (XPS), measuring the sputtering period when the amount of tin turns to not more than a detectable limit, and then making a conversion from the sputtering period with reference to $SiO_2$.

Also, the laminate of the present invention is a laminate, including a resin layer and an electroconductive layer bonded to the resin layer, wherein the electroconductive layer is the above-mentioned electroconductive layer of the present invention, and the copper-tin alloy layer of the electroconductive layer and the resin layer are bonded to each other.

Also, the process for producing an electroconductive layer of the present invention is a process for producing an electroconductive layer which is to be bonded to a resin layer, including: a plating treatment step for bringing a tin plating solution into contact with the surface of a copper layer, thereby forming a tin plating treated layer on the surface, and a removing step for bringing a tin stripping solution into contact with the surface of the tin plating treated layer, thereby removing a part of the tin plating treated layer while leaving a copper-tin alloy layer having a thickness of 0.001 to 0.020 µm.

Also, the process for producing a laminate of the present invention is a process for producing a laminate containing a resin layer and an electroconductive layer bonded to this resin layer, including a step for producing the electroconductive layer by the above-mentioned process for producing an electroconductive layer of the present invention, and a step for bonding the copper-tin alloy layer of the electroconductive layer and the resin layer to each other.

According to the electroconductive layer, the laminate using this layer, and the producing processes thereof of the invention, it is possible to provide a laminate which retains bondability between its electroconductive layer and its resin layer certainly, and which is further a laminate from which its copper-tin alloy layer is easily removed in a subsequent step.

DETAILED DESCRIPTION OF THE INVENTION

Figure 1:
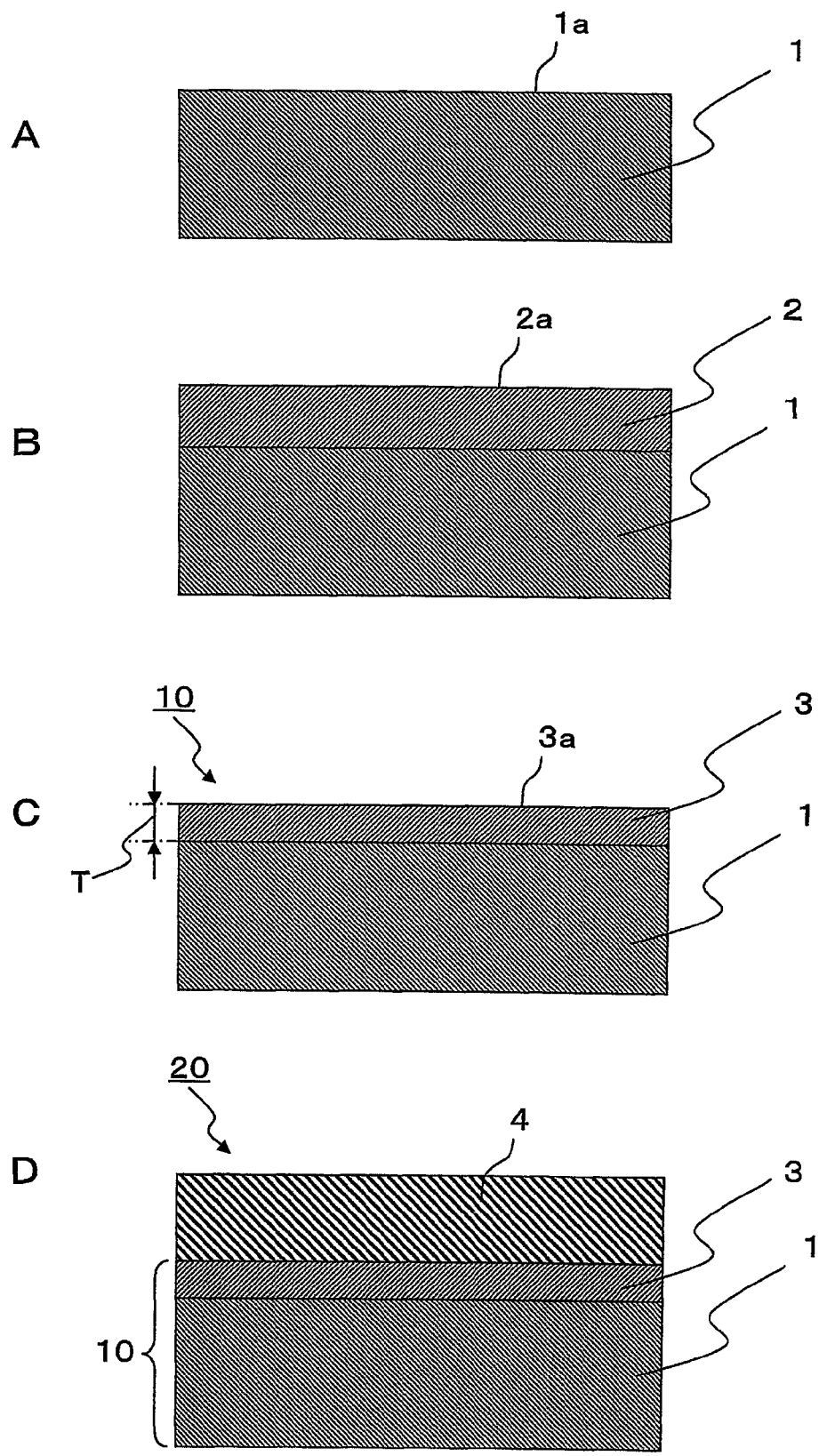
FIGS. 1A to 1D are sectional views which illustrate an example of a preferred producing process of the laminate of the invention, and correspond to respective steps in this process.

The electroconductive layer of the invention is an electroconductive layer which is to be bonded to a resin layer and which contains a copper layer and a copper-tin alloy layer laminated over the copper layer, wherein the copper-tin alloy layer has a thickness of 0.001 to 0.020 µm (preferably, 0.003 to 0.020 µm). According to the invention, the bondability to the resin layer can be certainly retained since the thickness of the copper-tin alloy layer is 0.001 m or more. Additionally, the copper-tin alloy layer is easily removed in a subsequent step since the above thickness is 0.020 µm or less. Moreover, diffusion of tin can be prevented since the copper-tin alloy layer in the invention is far thinner than conventional copper-tin alloy layers. Thus, the copper-tin alloy layer can be prevented from being made thicker with the passage of time. As a result, the copper-tin alloy layer is easily removed even after a long time elapses from the formation of the copper-tin alloy layer.

Further, the laminate of the invention is a laminate containing a resin layer and an electroconductive layer bonded to the resin layer, wherein the electroconductive layer is the above-mentioned electroconductive layer of the invention, and the copper-tin alloy layer of the electroconductive layer and the resin layer are bonded to each other. The electroconductive layer of the invention is used in the laminate of the invention; therefore, for the same reasons as described above, the provided laminate is a laminate which makes it possible to retain bondability between the electroconductive layer and the resin layer certainly, makes it easy to remove the copper-tin alloy layer in a subsequent step, and makes it easy to remove the copper-tin alloy layer even after a long time elapses from the formation of the copper-tin alloy layer.

The following will describe a preferred producing process of the electroconductive layer, and the laminate of the invention, referring appropriately to the drawings. FIGS. 1A to 1D, which are referred to, are sectional views which illustrate an example of the preferred producing process of the laminate of the invention, and correspond to respective steps in this process. Here, in FIGS. 1A to 1D, some portions are illustrated to be enlarged or reduced in order to make understanding of the descriptions easy.

The copper layer used in the electroconductive layer of the invention may be made of copper materials having various use purposes, examples of the materials including: such as copper foil (electrolytic copper foil or rolled copper foil) or copper plating film (electroless copper plating film or electrolytic copper plating film) used in an electronic component such as an electronic substrate or a lead frame, in an ornament, in an building member or in some other member; and line-, rod-, tube- and plate-form copper materials. The surface form of these copper materials may be smooth or may be made rough by etching. In order to use in an article which makes use of a high frequency, the surface preferably has a smoothness having the central line average roughness Ra of about 0.1 to 0.2 µm. With reference to FIGS. 1A to 1D, an example wherein a copper-tin alloy layer is formed in a plate-form copper layer will be described hereinafter.

As illustrated in FIG. 1A, for example, a copper layer 1 made of such as a copper foil or a copper layer of a copper-clad laminate is first prepared as a copper layer. The thickness of the copper layer 1 is, for example, from about 12 to 35 µm.

Next, a tin plating solution (not illustrated) is brought into contact with a surface 1a of the copper layer 1 to form a tin plating treated layer 2 on the surface 1a (a plating treatment step), as illustrated in FIG. 1B. Here, the tin content in the tin plating treated layer 2 decreases gradually from a surface 2a of the tin plating treated layer 2 toward the copper layer 1. On the other hand, the copper content in the tin plating treated layer 2 increases gradually from a surface 2a of the tin plating treated layer 2 toward the copper layer 1. In other words, at least a portion near the copper layer 1, in the tin plating treated layer 2, is formed as a copper-tin alloy layer. Here, the thickness of the tin plating treated layer 2 is, for example, from about 0.01 to 1 µm. The thickness is preferably from 0.01 to 0.1 µm from the viewpoint of the bondability thereof to a resin layer and the removable performance of the copper-tin alloy layer. The method for the plating in this case is not particularly limited; examples thereof include such as displacement tin plating, electroless tin plating (using a reducing agent), and tin electroplating. Of these methods, displacement tin plating is preferred since a copper-tin alloy layer 3 (see FIG. 1C) can easily be formed.

In the case of forming the tin plating treated layer 2 by displacement tin plating, the tin plating solution to be used is not particularly limited as far as the solution is the so-called displacement tin plating solution, which is a solution for forming a tin coating film on a copper surface by displacement reaction. As the displacement tin plating solution, for example, a solution containing an acid, a tin compound and a complexing agent may be used.

The acid contained in the displacement tin plating solution functions as a pH adjustor and a tin ion stabilizer. Examples of the acid include inorganic acids, such as hydrochloric acid, sulfuric acid, nitric acid, fluoroboric acid, and phosphoric acid; and water-soluble organic acids, such as carboxylic acids such as formic acid, acetic acid, propionic acid and butyric acid, alkanesulfonic acids such as methanesulfonic acid and ethanesulfonic acid, and aromatic sulfonic acids such as benzenesulfonic acid, phenolsulfonic acid and cresolsulofnic acid. Of the acids, sulfuric acid and hydrochloric acid are preferred from the viewpoint of the rate of forming the tin plating treated layer 2, the solubility of tin compounds therein, and the like. The concentration of the acid is preferably from 1 to 50% by mass, more preferably from 5 to 40% by mass, even more preferably from 10 to 30% by mass. When the concentration is in the range, the copper-tin alloy layer 3 (see FIG. 1C) can easily be formed.

The tin compound contained in the displacement tin plating solution may be selected from tin salts and tin oxides without any especial limitation as far as the compound is soluble in the acidic solution. Salts of tin with above-mentioned acids are preferred from the viewpoint of solubility thereof. For example, a stannous salt or a stannic salt may be used, examples thereof including such as stannous sulfate, stannic sulfate, stannous fluoroborate, stannic fluoroborate, stannous fluoride, stannic fluoride, stannous nitrate, stannic nitrate, stannous chloride, stannic chloride, stannous formate, stannic formate, stannous acetate, and stannic acetate. Of the salts, a stannous salt is preferably used from the viewpoint of a matter that the rate of forming the tin plating treated layer 2 is large; and a stannic salt is preferably used from the viewpoint of a matter that the stability thereof is high in the solution wherein the salt is dissolved. Further, in the case of using a tin oxide, stannous oxide is preferred from the viewpoint of the rate of forming the tin plating treated layer 2. The concentration of the tin compound is decided so as to set the concentration of tin preferably into the range of 0.05 to 10% by mass, more preferably into that of 0.1 to 5% by mass, even more preferably into that of 0.5 to 3% by mass. When the concentration is in the range, the copper-tin alloy layer 3 (see FIG. 1C) can easily be formed.

The complexing agent contained in the displacement tin plating solution is an agent which is coordinated to the copper layer 1 as an underlying layer to form a chelate, thereby making it easy to form the tin plating treated layer 2 on the surface 1a of the copper layer 1. For example, thiourea or a thiourea derivative may be used, examples of the derivative including such as 1,3-dimethylthiorea, 1,3-diethyl-2-thiourea, and thioglycolic acid. The concentration of the complexing agent ranges preferably from 1 to 50% by mass, more preferably from 5 to 40% by mass, even more preferably from 10 to 30% by mass. When the concentration is in this range, the bondability between the copper layer 1 and the tin plating treated layer 2 can be certainly retained without lowering the rate of forming the tin plating treated layer 2.

The displacement tin plating solution may contain, besides the above-mentioned components, additives such as a stabilizer and a surfactant.

The stabilizer is an additive for maintaining the concentrations of the individual components necessary for the reaction in the vicinity of the surface 1a of the copper layer 1. Examples thereof include such as glycols such as ethylene glycol, diethylene glycol and propylene glycol, and glycol esters such as cellosolve, carbitol and butyl carbitol. The concentration of the stabilizer ranges preferably from 1 to 80% by mass, more preferably from 5 to 60% by mass, and even more preferably from 10 to 50% by mass. When the concentration is in the range, the concentrations of the individual components necessary for the reaction can easily be maintained in the vicinity of the surface 1a of the copper layer 1.

Examples of the surfactant include such as nonionic surfactants, anionic surfactants, cationic surfactants, and ampholytic surfactants.

In the case of using a displacement tin plating solution as described above to form the tin plating treated layer 2, the formation can be attained under conditions described below.

First, the surface 1a of the copper layer 1 is washed with an acid or the like. Next, the copper layer 1 is immersed into a displacement tin plating solution, and then subjected to swinging immersion treatment for 5 seconds to 5 minutes. At this time, it is advisable that the temperature of the displacement tin plating solution is from 20 to 70° C. (preferably 20 to 40° C.). Thereafter, the treated surface is rinsed with water and dried, thereby forming the tin plating treated layer 2.

After the tin plating treated layer 2 is formed as described above, a tin stripping solution (not illustrated) is brought into contact with the surface 2a of this tin plating treated layer 2 to remove a part of the tin plating treated layer 2 while leaving the copper-tin alloy layer 3 having a thickness T of 0.001 to 0.020 μm (preferably having a thickness T of 0.003 to 0.020 μm) (a removing step). In this way, an electroconductive layer 10 which is an example of the invention is formed.

The above tin stripping solution may be any solution that is capable of etching tin. For example, an acidic solution or the like may be used, examples thereof including such as a solution of nitric acid in water, hydrochloric acid, a solution of sulfuric acid in water, and mixed solutions thereof. The concentration of the acid in the acidic solution ranges preferably from 0.1 to 10% by mass, more preferably from 0.3 to 5% by mass. When the concentration is in this range, the thickness of the copper-tin alloy layer 3 can easily be controlled in the above-mentioned range. A solution of nitric acid in water is particularly preferred since the rate of etching the tin plating treated layer 2 is large.

In the above removing step, the period when the surface 2a of the tin plating treated layer 2 and the tin stripping solution (preferably, a solution of nitric acid in water) is preferably from 5 to 120 seconds, more preferably from 10 to 30 seconds. When the period is in this range, the thickness of the copper-tin alloy layer 3 can easily be controlled into the above-mentioned range. The method for bringing the tin stripping solution into contact with the surface may be immersion, or a liquid-contacting treatment method using a spray or the like. Here, at this time, the temperature of the tin stripping solution is, for example, from about 25 to 35° C.

Further, from the end of the formation of the tin plating treated layer 2, the removing step is performed preferably within one hour, preferably within 10 minutes, even more preferably within 3 minutes for the following reason: the removing step is performed before displacement reaction between tin and copper advances excessively; thus, a part of the tin plating treated layer 2 can easily be removed.

Further, it is preferred that the tin plating treated layer 2 is kept at an atmospheric temperature of 80° C. or lower, preferably 30° C. or lower during the removing step is performed after the formation of the tin plating treated layer 2. This way makes it possible to prevent the displacement reaction between tin and copper from advancing excessively, so as to remove the tin plating treated layer 2 partially with ease. Here, the "atmospheric temperature" means the temperature of the vicinity of the tin plating treated layer 2. When the tin plating treated layer 2 is kept in a gas, the atmospheric temperature refers to the temperature of the gas. When the tin plating treated layer 2 is kept in a liquid, the temperature refers to the temperature of the liquid.

It is preferred that 80 at % of tin contained in the copper-tin alloy layer is present in the range from the surface 3a of the copper-tin alloy layer 3 to a depth of 0.001 to 0.010 μm therefrom. In other words, the thickness of the layer containing 80 at % of tin is preferably from 0.001 to 0.010 μm. When the thickness is in this range, the copper-tin alloy layer 3 can be effectively prevented from becoming large with the passage of time. Thus, even after a long time elapses after the formation of the copper-tin alloy layer 3, the copper-tin alloy layer 3 is more easily removed.

Further, the tin content in the copper-tin alloy layer 3 is preferably 0.05 g/m² or less, more preferably 0.02 g/m² or less. When the tin content is in this range, the copper-tin alloy layer 3 can be effectively prevented from becoming large with the passage of time. Thus, even after a long time elapses after the formation of the copper-tin alloy layer 3, the copper-tin alloy layer 3 is more easily removed. In this case, the tin content in the copper-tin alloy layer 3 is preferably 0.001 g/m² or more, more preferably 0.003 g/m² or more in order to maintain the bondability between the layer 3 and a resin layer certainly.

Further, the ratio by atomic percentage of tin to copper in the topmost surface of the copper-tin alloy layer 3 is preferably from 30/70 to 90/10, more preferably from 40/60 to 90/10, even more preferably from 65/35 to 85/15. When the ratio is in this range, the bondability between the layer 3 and a resin layer becomes high. Here, the topmost layer is a layer about which the sputtering period turns into 2 seconds when Arsputtering is performed at an accelerating voltage of 5 kV by XPS.

Here, the thickness (depth) of the layer containing 80 at % of tin, the tin content, and the ratio of tin to copper can be adjusted by varying, for example, the period until the removing step is performed after the formation of the tin plating treated layer 2, the retaining temperature during the period, or the like. Specifically, as the period until the removing step is performed is shorter, the tin content after the removing step is smaller since excessive diffusion of tin can be restrained. Additionally, the thickness of the layer containing 80 at % of tin is smaller and furthermore the ratio of tin to copper is smaller. Further, as the retaining temperature until the removing step is performed is lower, excessive diffusion of tin can be further restrained. Thus, the same control as described above can be attained.

As illustrated in FIG. 1D, in order to yield a laminate 20 by laminating a resin layer 4 onto the electroconductive layer 10, the resin layer 4 should be bonded onto the surface 3a of the copper-tin alloy layer 3 of the electroconductive layer 10. The method for the bonding at this time is not particularly limited, and should be appropriately selected in accordance with the shape of the resin layer 4 to be bonded. The method may be adopted, for example, laminating press, laminating, painting or the like.

Examples of the resin which constitutes the resin layer 4 include thermoplastic resins such as acrylonitrile/styrene copolymer resins (AS resins), acrylonitrile/butadiene/styrene terpolymer resins (ABS resins), fluorine-contained resins, polyamide, polyethylene, polyethylene terephthalate, polyvinylidene chloride, polyvinyl chloride, polycarbonate, polystyrene, polysulfone, polypropylene, and liquid crystal polymers; and thermosetting resins such as epoxy resins, phenol resins, polyimide, polyurethane, bismaleimide/triazine resins, modified polyphenylene ether, and cyanate esters. These resins may be modified with a functional group, or may be reinforced with glass fiber, aramide fiber, some other fiber, or the like. About the following resins out of these resins, large advantageous effects are produced in the case of using the invention since the resins are particularly low in bondability to the electroconductive layer: epoxy resins, phenol resins, polyimide, polyurethane, bismaleimide/triazine resins, modified polyphenylene ether, cyanate esters, and other highly heat-resistant resins, which each have a high glass transition temperature.

The above has described one of preferred embodiments; however, the invention is not limited to the embodiment. For example, with the reference to FIGS. 1A to 1D, an example using the plate-form copper layer 1 has been described; however, a copper wiring pattern layer may be used as the copper layer.

Further, in FIG. 1D, the flat resin layer 4 is illustrated; however, as the resin layer, for example, a solder resist pattern layer may be used. Also in this case, the copper-tin alloy layer naked from openings in the solder resist can easily be removed while the bondability between the electroconductive layer and the solder resist is certainly retained. Additionally, diffusion of tin can be prevented since the copper-tin alloy layer in the invention is far thinner than conventional copper-tin alloy layers. Thus, the copper-tin alloy layer naked from the openings is easily removed even after a long time elapses from the end of the formation of the copper-tin alloy layer. As the solution for removing the copper-tin alloy layer, concentrated nitric acid, a nitric-acid/hydrogen-peroxide based etching agent, an iron chloride based etching agent, or any other removing solution in which copper-tin alloy can be dissolved may be used. From the viewpoint of preventing the copper layer from being etched, it is preferred to use a nitric-acid/hydrogen-peroxide based etching agent or the like.

The laminate of the invention can certainly keep bondability between the copper layer and the resin layer (such as an insulating resin, an etching resist, an electroconductive resin, an electroconductive paste, an electroconductive adhesive, a dielectric resin, a hole-blocking-up resin, or a flexible coverlay film). Thus, the laminate can be used as a highly reliable wiring board for example. The laminate is particularly suitable for a build-up substrate wherein minute copper wiring and through-holes are to be made. The build-up substrate is classified into a build-up substrate of a single-operation lamination type, and a build-up substrate of a sequential build-up type. Further, in the case of the so-called metal core substrate, wherein a copper plate is used as a core member, having the above-mentioned copper-tin alloy layer formed on the surface of the copper plate, the bondability between the copper plate and an insulating resin laminated on the plate can be certainly retained; thus, this substrate becomes highly reliable.

EXAMPLES

Examples of the invention will be described together with comparative examples hereinafter. The invention should not be construed to be limited to the examples.

Example 1

A substrate wherein a copper electroplating layer 17 μm in thickness was formed on a copper-clad laminated plate (glass epoxy multi R-1766, manufactured by Matsushita Electric Industrial Co., Ltd.; copper foil piece thickness: 35 μm) was cut into a size of 100 mm×100 mm. This was immersed in a 10% by mass sulfuric acid solution for 30 seconds to clean the surface of the copper plating layer. The substrate was rinsed with water and then dried. The resultant was used as a test substrate. This test substrate was subjected to swinging immersion treatment in a displacement tin plating solution (T-9900) manufactured by Mec Co., Ltd. at 30° C. for 30 seconds. Thereafter, the substrate was rinsed with water, and then a tin plating treated layer was formed on the surface of the copper electroplating layer. Immediately after the formation, the tin plating treated layer was subjected to swinging immersion treatment in a 0.67% by mass solution of nitric acid in water at 30° C. for 20 seconds to remove a surface region of the tin plating treated layer. Thereafter, the resultant was rinsed with water, and then dried to form a copper-tin alloy layer. The tin content in the copper-tin alloy layer at this time was measured by a method described below.

First, the copper-tin alloy layer was dissolved in a 27% by mass solution of nitric acid in water, and the concentration of tin in this solution was measured with a Zeeman atomic absorptiometer (model number: AA-6800, manufactured by Shimadzu Corp.) by a calibration curve method. Then, the tin content per unit area was calculated out in accordance with the following equation:

Tin content $(g/m^2)$=tin concentration (ppm)×solution amount (g)/test substrate area $(m^2)$ Further, the same test substrate as described above was prepared. In the same manner as described above, a copper-tin alloy layer was formed on this substrate. Thereafter, a resin layer of a laminate for a build-up wiring board (resin with copper foil ABF-SHC, manufactured by Ajinomoto Co., Inc.) was put onto this copper-tin alloy layer, and the resultant was pressed at a press pressure (gauge pressure) of 30 MPa and a press temperature of 170° C. for a pressure period of 60 minutes. About the resultant laminate, the peel strength between the resin layer and the copper layer was measured in accordance with JIS C 6481.

Further, the same test substrate as described above was prepared. In the same manner as described above, a copper-tin alloy layer was formed on this substrate. Thereafter, about this copper-tin alloy layer, the composition analysis was made from the surface layer thereof along the depth direction with an X-ray photoelectron spectrometer (XPS meter) (model number: JPS-9010MC, manufactured by JEOL Ltd.) at an accelerating voltage of 5 kV until the period for Ar sputtering turned to 120 seconds. From the sputtering period giving not more than the detectable limit of tin, a conversion was made with reference to $SiO_2$ so as to calculate out the thickness of the copper-tin alloy layer. Here, according to the above-mentioned XPS meter, a case where the tin content is 1% or less by atom corresponds to not more than the detectable limit of tin. Further, from the sputtering period at which the peak of tin made its appearance, a conversion was made with reference to $SiO_2$ to calculate out the depth from which up to the surface 80 at % of the whole of tin was present. Furthermore, the topmost layer (layer about which the sputtering period turned into 2 seconds in the composition analysis along the depth direction according to the XPS meter) of the copper-tin alloy layer was subjected to composition analysis with the XPS meter, so as to calculate out the ratio by atomic percentage of tin to copper from the peaks of tin and copper.

The same test substrate as described above was prepared. In the same manner as described above, a copper-tin alloy layer was formed on this substrate. Thereafter, this was immersed in a nitric-acid/hydrogen-peroxide based solder stripping solution (product name: S-81, manufactured by Mec Co., Ltd.) at 30° C. for 30 seconds, and then rinsed sufficiently with water and dried. Thereafter, the XPS meter was used to measure five points selected at random from the surface. A case where the tin content was not more than the detectable limit (1% or less by atom) at the five points; a case where the number of points where tin was measured, out of the five points, was one or two; and a case where number of points where tin was measured, out of the points, was three or more were evaluated as follows: the removability of the copper-tin alloy layer was good (○); the removability was permissible (Δ); and the removability was bad (x), respectively.

Example 2

A tin plating treated layer was formed on the same test substrate as in Example 1 in the same manner as in Example 1, and the substrate was immediately immersed into hot water at 30° C., and allowed to stand still therein for one minute. Thereafter, the tin plating treated layer was immediately subjected to swinging immersion treatment in a 0.67% by mass solution of nitric acid in water at 30° C. for 20 seconds to remove a surface region of the tin plating treated layer. The resultant was then rinsed with water, and dried to form a copper-tin alloy layer. Then, in the same manner as in Example 1, the resultant was evaluated about the individual items.

Examples 3 to 11

The temperature of the hot water and the period for the immersion in Example 2 were changed to each temperature and each period in Table 1. In the same manner as in Example 2 except the change, samples of Examples 3 to 11 were yielded. The samples were evaluated in the same manner as in Example 1 about the individual items.

Examples 12 to 14

The concentration of nitric acid in the nitric acid solution in water of Example 1 was changed to each concentration in Table 1. In the same manner as in Example 1 except the change, samples of Examples 12 to 14 were yielded. The samples were evaluated in the same manner as in Example 1 about the individual items.

Comparative Example 1

A tin plating treated layer was formed on the same test substrate as in Example 1 in the same manner, but its surface layer was not removed. The resultant was used as a sample of Comparative Example 1. Immediately after the formation of the tin plating treated layer, the sample was evaluated in the same manner as in Example 1 about the individual items.

Comparative Example 2 to 4

The temperature of the hot water and the period for the immersion in Example 2 were changed to each temperature and each period in Table 1. In the same manner as in Example 2 except the change, samples of Comparative Example 2 to 4 were yielded. The samples were evaluated in the same manner as in Example 1 about the individual items.

Comparative Example 5

A sample wherein no tin plating treated layer was formed on the same test substrate as in Example 1 was used as a sample of Comparative Example 5. The sample was evaluated in the same manner as in Example 1 about the individual items.

The evaluation results of Examples 1 to 14 and Comparative Examples 1 to 5 are shown in Table 1.

TABLE 1

| | Rinsing with hot water | | Concentration in nitric acid solution in water [% by mass] | Alloy layer thickness | | Ratio by atomic percentage of tin/copper in topmost layer | Tin content [g/m²] | Depth from which up to surface 80 at % of tin was present | | Peel strength [N/mm] | Removability |
|---|---|---|---|---|---|---|---|---|---|---|---|
| | Temperature [° C.] | Immersing period [minute(s)] | | Sputtering period [seconds] | Thickness [μm] | | | Sputtering period [seconds] | Depth [μm] | | |
| Example 1 | No rinsing with hot water | | 0.67 | 14 | 0.005 | 75/25 | 0.004 | 6 | 0.002 | 1.05 | ○ |
| Example 2 | 30 | 1 | 0.67 | 16 | 0.006 | 72/28 | 0.006 | 8 | 0.003 | 1.00 | ○ |
| Example 3 | 30 | 3 | 0.67 | 16 | 0.006 | 70/30 | 0.006 | 8 | 0.003 | 1.07 | ○ |
| Example 4 | 30 | 10 | 0.67 | 24 | 0.009 | 65/35 | 0.010 | 10 | 0.004 | 1.02 | ○ |
| Example 5 | 30 | 30 | 0.67 | 32 | 0.012 | 61/39 | 0.017 | 14 | 0.005 | 0.98 | ○ |
| Example 6 | 30 | 60 | 0.67 | 44 | 0.016 | 40/60 | 0.033 | 20 | 0.007 | 0.83 | ○ |
| Example 7 | 40 | 1 | 0.67 | 18 | 0.007 | 67/33 | 0.008 | 8 | 0.003 | 1.03 | ○ |
| Example 8 | 50 | 1 | 0.67 | 22 | 0.008 | 65/35 | 0.009 | 10 | 0.004 | 1.03 | ○ |
| Example 9 | 60 | 1 | 0.67 | 24 | 0.009 | 63/37 | 0.014 | 10 | 0.004 | 0.92 | ○ |
| Example 10 | 70 | 1 | 0.67 | 32 | 0.012 | 60/40 | 0.025 | 14 | 0.005 | 0.85 | ○ |
| Example 11 | 80 | 1 | 0.67 | 52 | 0.019 | 30/70 | 0.048 | 24 | 0.009 | 0.80 | △ |
| Example 12 | No rinsing with hot water | | 0.10 | 24 | 0.009 | 90/10 | 0.008 | 8 | 0.003 | 0.81 | ○ |
| Example 13 | No rinsing with hot water | | 0.30 | 16 | 0.006 | 85/15 | 0.005 | 6 | 0.002 | 1.03 | ○ |
| Example 14 | No rinsing with hot water | | 0.20 | 24 | 0.009 | 80/20 | 0.007 | 8 | 0.003 | 1.01 | ○ |
| Comparative example 1 | No rinsing with hot water | | — | 88 | 0.032 | 95/5 | 0.430 | 40 | 0.014 | 0.35 | X |
| Comparative example 2 | 30 | 180 | 0.67 | 66 | 0.024 | 27/73 | 0.070 | 30 | 0.011 | 0.75 | X |
| Comparative example 3 | 90 | 1 | 0.67 | 66 | 0.024 | 25/75 | 0.098 | 30 | 0.011 | 0.77 | X |
| Comparative example 4 | 100 | 1 | 0.67 | 74 | 0.027 | 15/85 | 0.137 | 34 | 0.012 | 0.52 | X |
| Comparative example 5 | No rinsing with hot water | | — | — | 0.000 | 0/100 | 0.000 | — | — | 0.44 | — |

As shown in Table 1, Examples 1 to 14 of the invention were better in both of peel strength and removability than Comparative Examples 1 to 5.

Comparison about Change with Time

Figure 2:
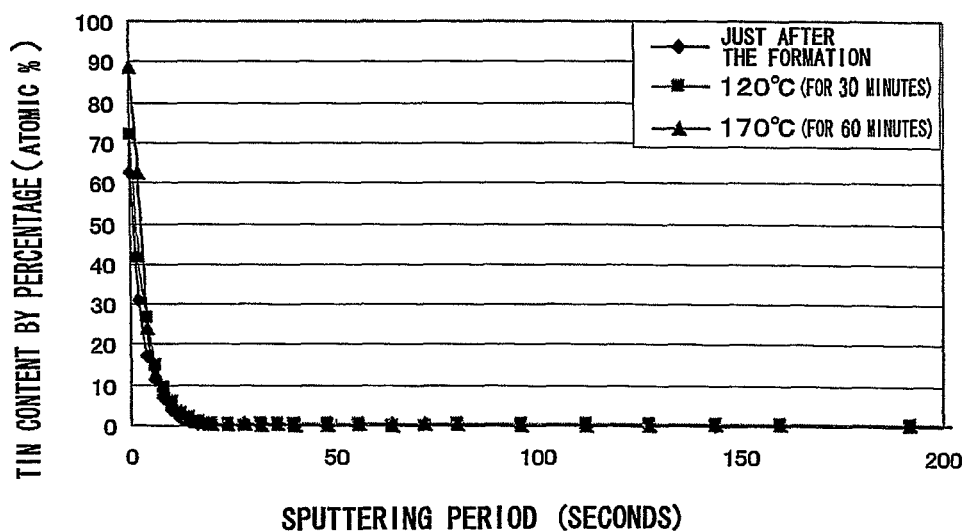
FIG. 2 is a graph showing the tin content by percentage to the sputtering period in an electroconductive layer of an example of the invention.
Figure 3:
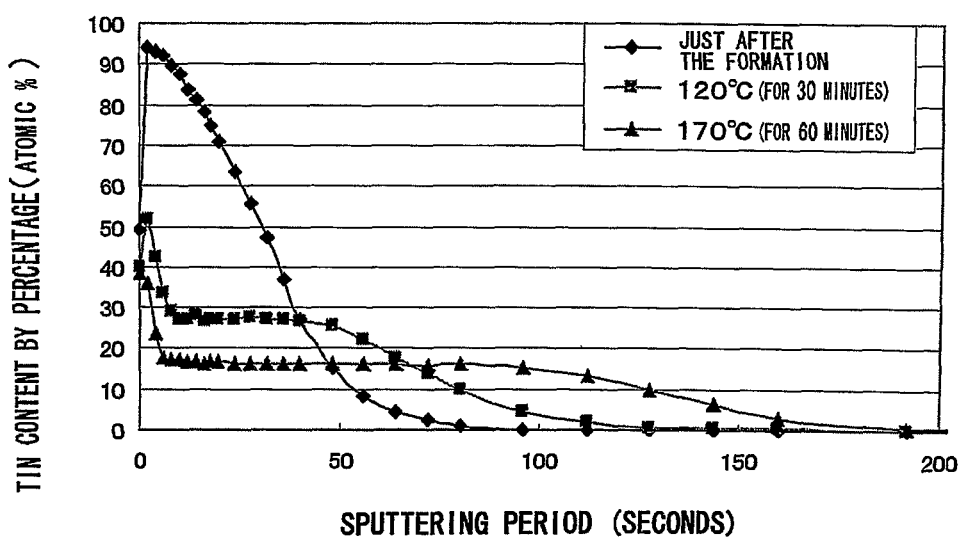
FIG. 3 is a graph showing the tin content by percentage to the sputtering period in an electroconductive layer of a comparative example.

Copper-tin alloy layers were formed in the same manner as in Example 1. One of the layers was subjected to composition analysis along the depth direction according to the XPS meter (until the Ar sputtering period turned to 200 seconds) just after the formation. One of the layers was heated at 120° C. for 30 minutes and immediately subjected to the same analysis. And one of the layers was heated at 170° C. for 60 minutes and immediately subjected to the same analysis. The thickness of each of the copper-tin alloy layers was measured in the same manner as described above. As a result, the thickness just after the formation was 0.005 μm. The thickness just after the heating at 120° C. (for 30 minutes) and that just after the heating at 170° C. (for 60 minutes) were each 0.006 μm. About each of these cases, the tin content by percentage versus the sputtering period is shown in FIG. 2. Furthermore, about a tin plating treated layer formed in the same manner as in Comparative Example 1, the alloy layer thickness was measured in the same manner. As a result, the thickness just after the formation, that just after the heating at 120° C. (for 30 minutes), and that just after the heating at 170° C. (for 60 minutes) were 0.032 μm, 0.048 μm, and 640 μm, respectively. About each of these cases, the tin content by percentage versus the sputtering period is shown in FIG. 3. From comparison of these results with each other, it has been understood that according to the invention, the copper-tin alloy layer can be prevented from becoming large with the passage of time.

What is claimed is:

1. An electroconductive layer which is to be bonded to a resin layer, and which comprises a copper layer and a copper-tin alloy layer consisting essentially of copper and tin laminated over the copper layer,
   wherein the copper-tin alloy layer has a thickness of 0.001 to 0.020 μm, and
   the ratio by atomic percentage of tin to copper in the topmost surface of the copper-tin alloy layer is from 30/70 to 90/10.

2. The electro conductive layer according to claim 1, wherein the tin content in the copper-tin alloy layer is 0.05 g/m² or less.

3. A laminate, comprising a resin layer and an electroconductive layer bonded to the resin layer,
   wherein the electroconductive layer is an electroconductive layer as recited in claim 1, and
   the copper-tin alloy layer of the electroconductive layer and the resin layer are bonded to each other.

4. A process for producing an electroconductive layer which is to be bonded to a resin layer, comprising:
   a plating treatment step for bringing a tin plating solution into contact with the surface of a copper layer, thereby forming a tin plating treated layer consisting essentially of copper and tin on the surface, and
   a removing step for bringing a tin stripping solution into contact with the surface of the tin plating treated layer, thereby removing a part of the tin plating treated layer while leaving a copper-tin alloy layer having a thickness of 0.001 to 0.020 μm and the ratio by atomic percentage of tin to copper in the topmost surface of the copper-tin alloy layer is from 30/70 to 90/10.

5. The process for producing an electroconductive layer according to claim 4, wherein the tin content in the copper-tin alloy layer is 0.05 g/m$^2$ or less.

6. The process for producing an electroconductive layer according to claim 4, wherein within one hour from the end of the plating treatment step, the removing step is performed.

7. The process for producing an electroconductive layer according to claim 4, wherein the tin plating treated layer is kept at an atmospheric temperature of 80° C. or lower during the removing step is performed after the plating treatment step.

8. The process for producing an electroconductive layer according to claim 4, wherein the tin stripping solution is an acidic solution.

9. The process for producing an electroconductive layer according to claim 8, wherein the acid concentration in the acidic solution is from 0.1 to 10% by mass.

10. The process for producing an electroconductive layer according to claim 8, wherein the acidic solution is a solution of nitric acid in water.

11. The process for producing an electroconductive layer according to claim 4, wherein the period when the surface of the tin plating treated layer and the tin stripping solution contact each other is from 5 to 120 seconds in the removing step.

* * * * *

UNITED STATES PATENT AND TRADEMARK OFFICE
CERTIFICATE OF CORRECTION

PATENT NO. : 8,828,554 B2
APPLICATION NO. : 12/352048
DATED : September 9, 2014
INVENTOR(S) : Mutsuyuki Kawaguchi It is certified that error appears in the above-identified patent and that said Letters Patent is hereby corrected as shown below:

In The Specification

In column 3 at line 40, Change "0.001 m" to --0.001 μm--.

In column 4 at lines 63-64, Change "cresolsulofnic" to --cresolsulfonic--.

In column 5 at line 35, Change "1,3-dimethylthiorea," to --1,3-dimethylthiourea,--.

In column 7 at line 20, Change "Arsputtering" to --Ar sputtering--.

In column 7 at line 58 (approx.), Change "aramide" to --aramid--.

In The Claims

In column 12 at line 45 (approx.), In Claim 2, change "electro conductive" to --electroconductive--.

Signed and Sealed this
Eleventh Day of August, 2015

Michelle K. Lee
*Director of the United States Patent and Trademark Office*